(12) United States Patent
Pagaila et al.

(10) Patent No.: US 8,241,955 B2
(45) Date of Patent: *Aug. 14, 2012

(54) INTEGRATED CIRCUIT PACKAGING SYSTEM WITH MOUNTABLE INWARD AND OUTWARD INTERCONNECTS AND METHOD OF MANUFACTURE THEREOF

(75) Inventors: Reza Argenty Pagaila, Singapore (SG); Byung Tai Do, Singapore (SG); Jong-Woo Ha, Seoul (KR)

(73) Assignee: Stats Chippac Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 13/090,192

(22) Filed: Apr. 19, 2011

(65) Prior Publication Data

US 2011/0256664 A1    Oct. 20, 2011

Related U.S. Application Data

(63) Continuation-in-part of application No. 12/488,089, filed on Jun. 19, 2009, now Pat. No. 7,927,917.

(51) Int. Cl.
*H01L 21/00*    (2006.01)

(52) U.S. Cl. ........ 438/108; 257/686; 257/E23.031; 257/E21.502; 257/E21.503

(58) Field of Classification Search .......... 438/108, 438/109, 112, 121, 124, 126, 127; 257/666, 257/686, 734, E23.031, E21.502, E21.509
See application file for complete search history.

(56) References Cited

U.S. PATENT DOCUMENTS

| | | | |
|---|---|---|---|
| 6,489,676 B2 | 12/2002 | Taniguchi et al. | |
| 6,812,066 B2 | 11/2004 | Taniguchi et al. | |
| 6,847,109 B2 | 1/2005 | Shim | |
| 7,034,386 B2 | 4/2006 | Kurita | |
| 7,049,528 B2 | 5/2006 | Kariya et al. | |
| 7,185,426 B1 | 3/2007 | Hiner et al. | |
| 7,345,361 B2 | 3/2008 | Mallik et al. | |
| 7,927,917 B2 * | 4/2011 | Pagaila et al. | 438/108 |
| 2007/0164457 A1 | 7/2007 | Yamaguchi et al. | |
| 2007/0241442 A1 | 10/2007 | Ha et al. | |
| 2008/0073771 A1 | 3/2008 | Seo et al. | |
| 2008/0111215 A1 | 5/2008 | Shim et al. | |
| 2008/0230887 A1 | 9/2008 | Sun et al. | |
| 2009/0115043 A1 | 5/2009 | Chow et al. | |
| 2009/0127715 A1 * | 5/2009 | Shin et al. | 257/777 |
| 2010/0133665 A1 | 6/2010 | Ha et al. | |
| 2010/0244212 A1 | 9/2010 | Ha et al. | |
| 2011/0057308 A1 | 3/2011 | Choi et al. | |

* cited by examiner

*Primary Examiner* — Brook Kebede
(74) *Attorney, Agent, or Firm* — Ishimaru & Associates LLP; Mikio Ishimaru; Stanley M. Chang

(57) ABSTRACT

A method of manufacture of an integrated circuit packaging system includes: providing a base circuit assembly having an integrated circuit device; mounting a pre-formed conductive frame having an outer interconnect and an inner interconnect over the base circuit assembly, the inner interconnect on the integrated circuit device and the outer interconnect around the integrated circuit device; applying an encapsulant over the inner interconnect and the outer interconnect; and removing a portion of the pre-formed conductive frame exposing an end of the inner interconnect and the outer interconnect.

20 Claims, 7 Drawing Sheets

US 8,241,955 B2

INTEGRATED CIRCUIT PACKAGING SYSTEM WITH MOUNTABLE INWARD AND OUTWARD INTERCONNECTS AND METHOD OF MANUFACTURE THEREOF

CROSS-REFERENCE TO RELATED APPLICATION(S)

This is a continuation-in-part of U.S. patent application Ser. No. 12/488,089 filed Jun. 19, 2009, now U.S. Pat. No. 7,927,917.

TECHNICAL FIELD

The present invention relates generally to an integrated circuit packaging system, and more particularly to a system for multiple stack integrated circuit packaging systems.

BACKGROUND ART

Products must compete in world markets and attract many consumers or buyers in order to be successful. It is very important for products to continue to improve in features, performance, and reliability while reducing product costs, product size, and equally important to be available quickly for purchase by the consumers or buyers.

The integrated circuit package is the building block used in a high performance electronic system to provide applications for usage in products such as automotive vehicles, pocket personal computers, cell phone, intelligent portable military devices, aeronautical spacecraft payloads, and a vast line of other similar products that require small compact electronics supporting many complex functions.

A small product, such as a cell phone, can contain many integrated circuit packages, each having different sizes and shapes. Each of the integrated circuit packages within the cell phone can contain large amounts of complex circuitry. The circuitry within each of the integrated circuit packages work and communicate with other circuitry of other integrated circuit packages and electrical parts using electrical connections on circuit boards.

Time to market, reliability, the number of integrated circuit packages, and the number of electrical parts on the circuit boards inside a product are important to improving the features, performance, and reliability of any product. Furthermore, the ways the circuitry and electrical connections are implemented have a direct impact on the availability, reliability, and costs of products.

Attempts have failed to provide a complete solution addressing simplified manufacturing processing, time to market, reliability, reduction of electrical parts on the circuit boards, size reductions of the circuit boards and the integrated circuit packages, with increased functionality, leveragability, and increased product features to the consumer.

Thus, a need remains for improvements with the integrated circuit packaging system for the world markets. In view of the economic and technological challenges, it is increasingly critical that answers be found to these problems.

In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought after but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a base circuit assembly having an integrated circuit device; mounting a pre-formed conductive frame having an outer interconnect and an inner interconnect over the base circuit assembly, the inner interconnect on the integrated circuit device and the outer interconnect around the integrated circuit device; applying an encapsulant over the inner interconnect and the outer interconnect; and removing a portion of the pre-formed conductive frame exposing an end of the inner interconnect and the outer interconnect.

The present invention provides an integrated circuit packaging system including: a base circuit assembly having an integrated circuit device; an outer interconnect; an inner interconnect over the base circuit assembly, the inner interconnect on the integrated circuit device and the outer interconnect around the integrated circuit device; and an encapsulant applied over the inner interconnect and the outer interconnect and with the inner interconnect and the outer interconnect substantially exposed.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
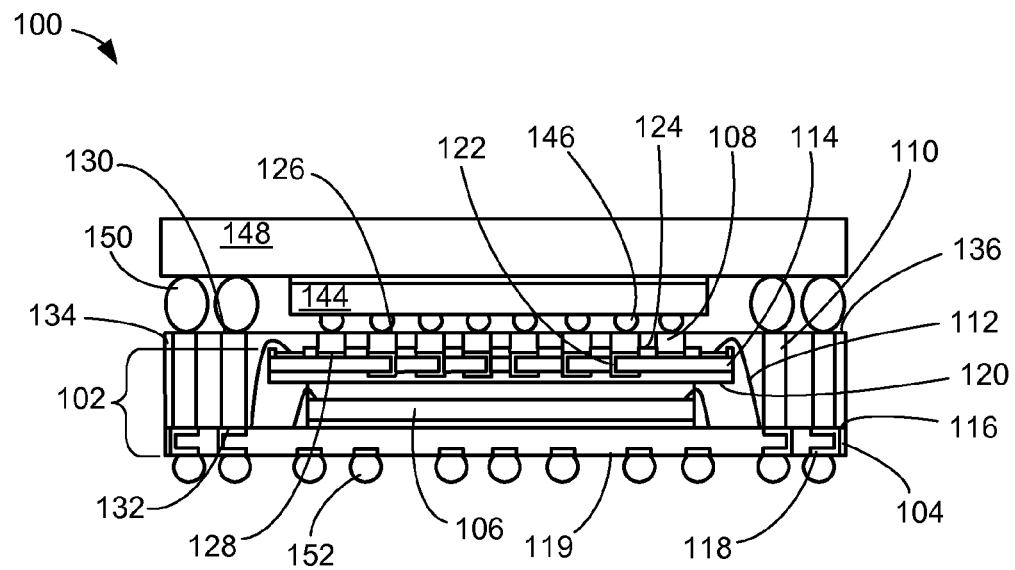
FIG. 1 is a cross-sectional view of an integrated circuit packaging system in a first embodiment of the present invention taken along a line 1-1 of FIG. 2.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown greatly exaggerated in the drawing FIGs. Similarly, although the views in the drawings shown for ease of description and generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the present invention, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements.

The term "active side" refers to a side of a die, a module, a package, or an electronic structure having active circuitry fabricated thereon or having elements for connection to the active circuitry within the die, the module, the package, or the electronic structure. The term "physical tool marks" refers to a detectable physical appearance on a surface of an element that is the result of a manufacturing processes such as grinding, sanding, etching, polishing, cutting, or sawing.

The term "processing" as used herein includes deposition of material or photoresist, patterning, exposure, development, etching, cleaning, and/or removal of the material or photoresist as required in forming a described structure.

Figure 2:
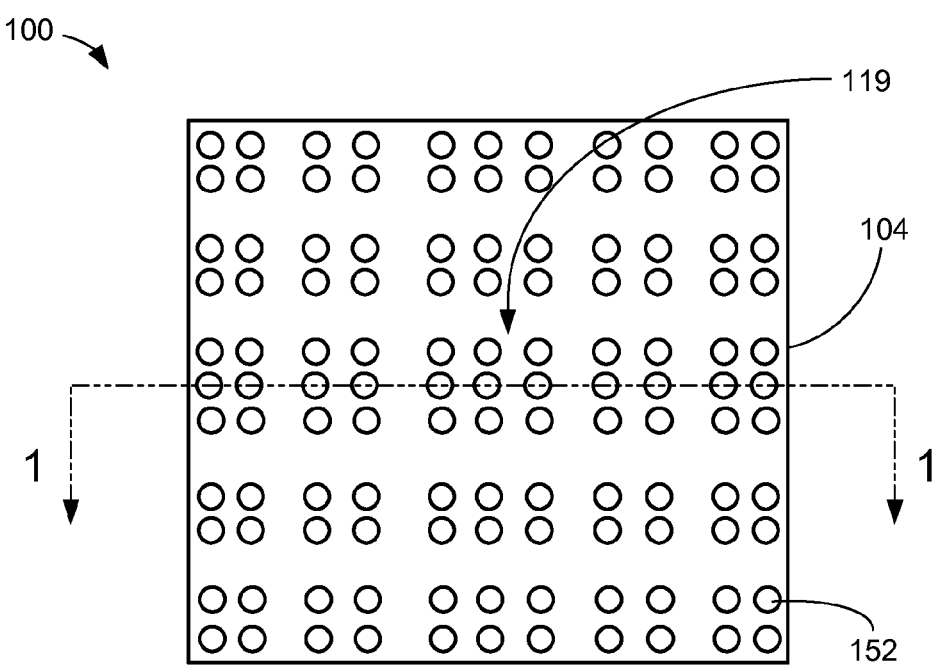
FIG. 2 is a bottom view of the integrated circuit packaging system of FIG. 1.

Referring now to FIG. 1, therein is shown a cross-sectional view of an integrated circuit packaging system 100 in a first embodiment of the present invention taken along a line 1-1 of FIG. 2. The integrated circuit packaging system 100 can include a base circuit assembly 102, such as a fan-in package on package (Fi-POP) structure, with a bottom substrate 104, an integrated circuit device 106, inner interconnects 108, outer interconnects 110, base interconnects 112, and a top substrate 114.

The integrated circuit device 106, such as a flip chip, an internal stacking module (ISM), or a package with circuitry, can be mounted, such as by an adhesive mounting, over a component side 116 of the bottom substrate 104. An active side of the integrated circuit device 106 can be facing away from the component side 116.

A bottom conductive trace 118, such as a copper trace, an aluminum trace, or other metal trace with similar characteristics, can be exposed adjacent the component side 116 and a system side 119. The bottom conductive trace 118 can be formed within the bottom substrate 104 to provide connectivity between the component side 116 and the system side 119 of the bottom substrate 104 opposite the component side 116. The active side of the integrated circuit device 106 can be connected to the bottom conductive trace 118 adjacent the component side 116 using the base interconnects 112 such as wires, leads, balls, or bumps.

The top substrate 114, such as a substrate, a circuit board, or an interposer, can be mounted, such as by an adhesive mounting, over the integrated circuit device 106 with a first side 120 of the top substrate 114 facing the integrated circuit device 106. The top substrate 114 can include a top conductive trace 122 exposed adjacent the first side 120, exposed adjacent a second side 124 of the top substrate 114 opposite the first side 120, and within the top substrate 114.

The top conductive trace 122, such as a copper trace, an aluminum trace, or other metal trace with similar characteristics, can provide connectivity between the first side 120 and the second side 124 of the top substrate 114. The top conductive trace 122 exposed along a perimeter of the second side 124 can be connected with the bottom conductive trace 118 of the component side 116 using the base interconnects 112.

Each of the inner interconnects 108 provide an electrical or a thermal conduction path from the integrated circuit device 106 to an environment external to the integrated circuit packaging system 100. Examples of the inner interconnects 108 are short connectors, conductive posts, conductive pillars, conductive pins, vertical insertion areas (VIA), planar conductive structures, leads, or a combination thereof.

Each of the inner interconnects 108 can include an end with an inner exposed contact surface 126 and an opposite end with an inner attachment surface 128. The inner interconnects 108 can have any different shape, size, or distribution to provide capabilities for fan-in connections with the base circuit assembly 102. The inner attachment surface 128 can be connected to the top conductive trace 122 exposed adjacent the second side 124 of the top substrate 114 and over the integrated circuit device 106.

Each of the outer interconnects 110, such as through conductors, conductive posts, pillars, pins, vertical insertion areas (VIA), or leads, include an end with an outer exposed contact surface 130 and an opposite end with an outer attachment surface 132. The outer interconnects 110 can have any length preferably greater than a length of the inner interconnects 108. The outer interconnects 110 can also be formed having different shapes, sizes, or distributions to provide capabilities for fan-out connections with the base circuit assembly 102.

The outer interconnects 110 can be located adjacent the top substrate 114 and around the integrated circuit device 106. The outer attachment surface 132 can be connected to the bottom conductive trace 118 of the bottom substrate 104 exposed adjacent a perimeter of the component side 116.

For purposes of illustration, the outer interconnects 110 are shown longer than the inner interconnects 108. Both the outer interconnects 110 and the inner interconnects 108 are shown having similar shape and distribution. The outer interconnects 110 and the inner interconnects 108 can each have any different length, shape, or distribution. For example, the outer interconnects 110 can be spaced further apart than the inner interconnects 108, the outer interconnects 110 can be curved shaped, or the inner interconnects 108 can be non-vertical shaped.

It has been discovered that the outer interconnects 110 and the inner interconnects 108 provides improved three-dimensional (3D) packaging capabilities. Having the outer interconnects 110 lengths different from lengths of the inner interconnects 108 provide the present invention with the capability of attaching components at different vertical heights over the base circuit assembly 102. Flexibility of shape and distribution of the outer interconnects 110 and the inner interconnects 108 provide the capability to horizontally offset the components. The combined capability of vertical and horizontal component placement provides substantial improvements in minimizing the size and maximizing the density of stack package assemblies.

An encapsulant 134 can cover the component side 116, the top substrate 114, and surround the outer interconnects 110 and the inner interconnects 108. The encapsulant 134 can protect the integrated circuit packaging system 100 using materials such as an epoxy, an epoxy blend, a silicone material, a polymide, or similar molding compound.

The outer exposed contact surface 130 and the inner exposed contact surface 126 can preferably be adjacent and coplanar with a top encapsulant surface 136 of the encapsulant 134. The inner exposed contact surface 126 and the outer exposed contact surface 130 exhibit physical tool marks. The outer interconnects 110 can extend from the top encapsulant surface 136 to a surface opposite the top encapsulant surface 136 of the encapsulant 134.

It has been discovered that the outer interconnects 110 or the inner interconnects 108 can provide fine pitch input or output capabilities. The outer interconnects 110 or the inner interconnects 108 can provide a higher pitch density than other package interconnects such as an embedded Solder On Pad (e-SOP) or a ball grid array (BGA). For example, the outer interconnects or the inner interconnects 108 can be formed as pillars having diameters capable of providing effective pitch yields less than 100 um.

It has been unexpectedly found that fabrication process flow of the outer interconnects 110 or the inner interconnects 108 is improved over a conventional process flow of internal interconnect solutions such as vertical insertion areas (VIA), posts, pins, or pillars. The conventional process flow of internal interconnect solutions rely manufacturing reflow processes. The outer interconnects 110 or the inner interconnects 108 do not require reflow processes which can result in substantial production costs savings attributed to factors such as simplified assembly environment, reduction of equipment, and a reduction in manufacturing process steps.

A first component 144, such as a package, a module, a component stack, or a discrete component, can be mounted over the encapsulant 134 using first component connectors 146. The first component connectors 146, such as conductive balls, bumps, pins, or pads, can be used to connect the first component 144 with the inner exposed contact surface 126 adjacent the top encapsulant surface 136.

A second component 148, such as a package, a module, a component stack, or a discrete component, can be mounted over the first component 144 using second component connectors 150. The second component connectors 150, such as conductive balls, bumps, pins, or pads, can be used to connect the second component 148 with the outer exposed contact surface 130 adjacent the top encapsulant surface 136.

For purposes of illustration, the first component 144 and the second component 148 are shown connected to the inner interconnects 108 and the outer interconnects 110 respectively. Any number or different types of external devices, such as packages, modules, or discrete components can be connected to the outer interconnects 110 or the inner interconnects 108. For example, the first component 144 can be connected to the outer interconnects 110 and the inner interconnects 108 of the integrated circuit packaging system 100.

System connectors 152 can be attached to the bottom conductive trace 118 exposed adjacent the system side 119. The system connectors 152, such as solder balls, solder bumps, or similar conductive connectors, can have any shape or distribution. The system connectors 152 can be used to provide connectivity between the integrated circuit packaging system 100 and a next level of system integration such as a printed circuit board or another integrated circuit package.

Referring now to FIG. 2, therein is shown a bottom view of the integrated circuit packaging system 100 of FIG. 1. The system side 119 of the bottom substrate 104 is shown with the system connectors 152 substantially exposed. The system connectors 152 can have any shape or distribution.

Figure 3:
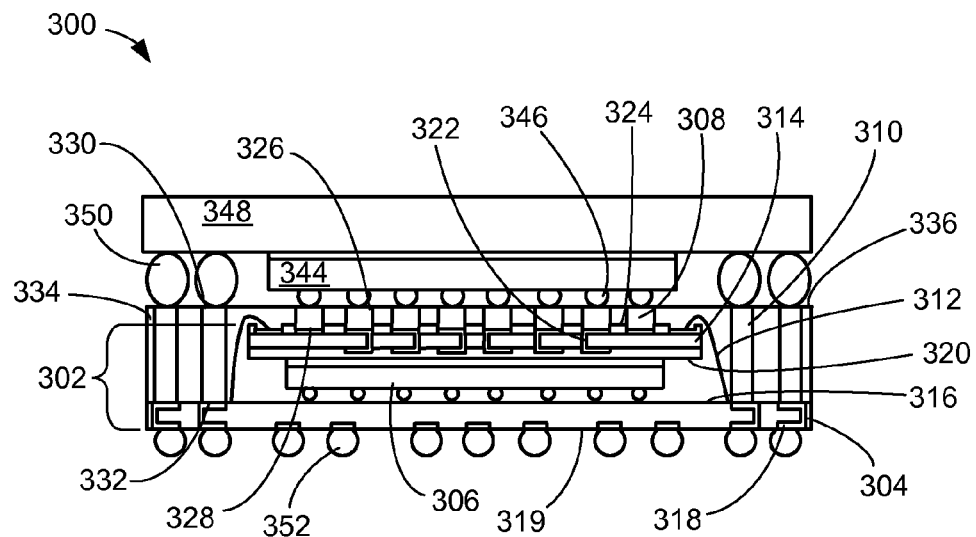
FIG. 3 is a cross-sectional view similar to FIG. 2 of an integrated circuit packaging system in a second embodiment of the present invention.

Referring now to FIG. 3, therein is shown a cross-sectional view similar to FIG. 2 of an integrated circuit packaging system 300 in a second embodiment of the present invention.

The integrated circuit packaging system 300 can include a base circuit assembly 302, such as a fan-in package on package (Fi-POP) structure, with a bottom substrate 304, an integrated circuit device 306, inner interconnects 308, outer interconnects 310, base interconnects 312, and a top substrate 314.

The integrated circuit device 306, such as a flip chip, an internal stacking module (ISM), or a package with circuitry, can be mounted, such as by an adhesive mounting, over a component side 316 of the bottom substrate 304. The integrated circuit device 306 of the integrated circuit packaging system 300 is shown as a flip chip. An active side of the integrated circuit device 306 can be facing the component side 316.

A bottom conductive trace 318, such as a copper trace, an aluminum trace, or other metal trace with similar characteristics, can be exposed adjacent the component side 316 and a system side 319. The bottom conductive trace 318 can be formed within the bottom substrate 304 to provide connectivity between the component side 316 and the system side 319 of the bottom substrate 304 opposite the component side 316. The active side of the integrated circuit device 306 can be connected to the bottom conductive trace 318 adjacent the component side 316 using the base interconnects 312 such as wires, leads, balls, or bumps.

The top substrate 314, such as a substrate, a circuit board, or an interposer, can be mounted, such as by an adhesive mounting, over the integrated circuit device 306 with a first side 320 of the top substrate 314 facing the integrated circuit device 306. The top substrate 314 can include a top conductive trace 322 exposed adjacent the first side 320, exposed adjacent a second side 324 of the top substrate 314 opposite the first side 320, and within the top substrate 314.

The top conductive trace 322, such as a copper trace, an aluminum trace, or other metal trace with similar characteristics, can provide connectivity between the first side 320 and the second side 324 of the top substrate 314. The top conductive trace 322 exposed along a perimeter of the second side 324 can be connected with the bottom conductive trace 318 of the component side 316 using the base interconnects 312.

Each of the inner interconnects 308 provide an electrical or a thermal conduction path from the integrated circuit device 306 to an environment external to the integrated circuit packaging system 300. Examples of the inner interconnects 308 are short connectors, conductive posts, conductive pillars, conductive pins, vertical insertion areas (VIA), planar conductive structures, leads, or a combination thereof.

Each of the inner interconnects 308 can include an end with an inner exposed contact surface 326 and an opposite end with an inner attachment surface 328. The inner interconnects 308 can have any different shape, size, or distribution to provide capabilities for fan-in connections with the base circuit assembly 302. The inner attachment surface 328 can be connected to the top conductive trace 322 exposed adjacent the second side 324 of the top substrate 314 and over the integrated circuit device 306.

Each of the outer interconnects 310, such as through conductors, conductive posts, pillars, pins, vertical insertion areas (VIA), or leads, include an end with an outer exposed contact surface 330 and an opposite end with an outer attachment surface 332. The outer interconnects 310 can have any length preferably greater than a length of the inner interconnects 308. The outer interconnects 310 can also be formed having different shapes, sizes, or distributions to provide capabilities for fan-out connections with the base circuit assembly 302.

The outer interconnects 310 can be located adjacent the top substrate 314 and around the integrated circuit device 306. The outer attachment surface 332 can be connected to the bottom conductive trace 318 of the bottom substrate 304 exposed adjacent a perimeter of the component side 316.

For purposes of illustration, the outer interconnects 310 are shown longer than the inner interconnects 308. Both the outer interconnects 310 and the inner interconnects 308 are shown having similar shape and distribution. The outer interconnects 310 and the inner interconnects 308 can each have any different length, shape, or distribution. For example, the outer interconnects 310 can be spaced further apart than the inner interconnects 308, the outer interconnects 310 can be curved shaped, or the inner interconnects 308 can be non-vertical shaped.

An encapsulant 334 can cover the component side 316, the top substrate 314, and surround the outer interconnects 310 and the inner interconnects 308. The encapsulant 334 can protect the integrated circuit packaging system 300 using materials such as an epoxy, an epoxy blend, a silicone material, a polymide, or similar molding compound.

The outer exposed contact surface 330 and the inner exposed contact surface 326 can preferably be adjacent and coplanar with a top encapsulant surface 336 of the encapsulant 334. The inner exposed contact surface 326 and the outer exposed contact surface 330 exhibit physical tool marks. The outer interconnects 310 can extend from the top encapsulant surface 336 to a surface opposite the top encapsulant surface 336 of the encapsulant 334.

A first component 344, such as a package, a module, a component stack, or a discrete component, can be mounted over the encapsulant 334 using first component connectors 346. The first component connectors 346, such as conductive balls, bumps, pins, or pads, can be used to connect the first component 344 with the inner exposed contact surface 326 adjacent the top encapsulant surface 336.

A second component 348, such as a package, a module, a component stack, or a discrete component, can be mounted over the first component 344 using second component connectors 350. The second component connectors 350, such as conductive balls, bumps, pins, or pads, can be used to connect the second component 348 with the outer exposed contact surface 330 adjacent the top encapsulant surface 336.

System connectors 352 can be attached to the bottom conductive trace 318 exposed adjacent the system side 319. The system connectors 352, such as solder balls, solder bumps, or similar conductive connectors, can have any shape or distribution. The system connectors 352 can be used to provide connectivity between the integrated circuit packaging system 300 and a next level of system integration such as a printed circuit board or another integrated circuit package.

Figure 4:
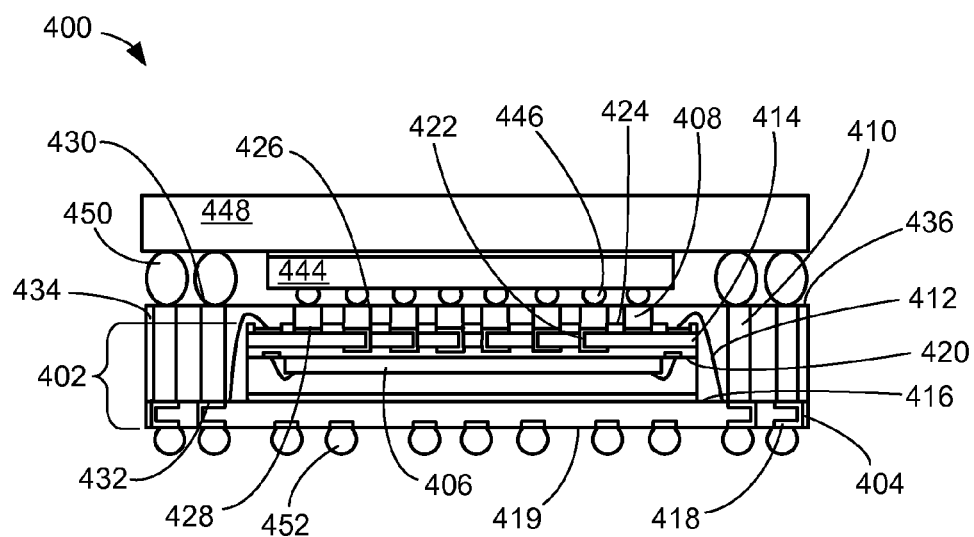
FIG. 4 is a cross-sectional view similar to FIG. 2 of an integrated circuit packaging system in a third embodiment of the present invention.

Referring now to FIG. 4, therein is shown a cross-sectional view similar to FIG. 2 of an integrated circuit packaging system 400 in a third embodiment of the present invention.

The integrated circuit packaging system 400 can include a base circuit assembly 402, such as a fan-in package on package (Fi-POP) structure, with a bottom substrate 404, an integrated circuit device 406, inner interconnects 408, outer interconnects 410, base interconnects 412, and a top substrate 414.

The integrated circuit device 406, such as a flip chip, an internal stacking module (ISM), or a package with circuitry, can be mounted, such as by an adhesive mounting, over a component side 416 of the bottom substrate 404. The integrated circuit device 406 of the integrated circuit packaging system 400 is shown as an ISM. An active side of the integrated circuit device 406 can be connected to the top substrate 414 over the component side 416 of the bottom substrate 404. The active side of the integrated circuit device 406 could optionally be connected to the component side 416 of the bottom substrate 404.

A bottom conductive trace 418, such as a copper trace, an aluminum trace, or other metal trace with similar characteristics, can be exposed adjacent the component side 416 and a system side 419. The bottom conductive trace 418 can be formed within the bottom substrate 404 to provide connectivity between the component side 416 and the system side 419 of the bottom substrate 404 opposite the component side 416.

The top substrate 414, such as a substrate, a circuit board, or an interposer, can be mounted, such as by an adhesive mounting, over the integrated circuit device 406 with a first side 420 of the top substrate 414 facing the integrated circuit device 406. The top substrate 414 can include a top conductive trace 422 exposed adjacent the first side 420, exposed adjacent a second side 424 of the top substrate 414 opposite the first side 420, and within the top substrate 414.

The top conductive trace 422, such as a copper trace, an aluminum trace, or other metal trace with similar characteristics, can provide connectivity between the first side 420 and the second side 424 of the top substrate 414. The top conductive trace 422 exposed along a perimeter of the second side 424 can be connected with the bottom conductive trace 418 of the component side 416 using the base interconnects 412 such as wires, leads, balls, or bumps.

Each of the inner interconnects 408 provide an electrical or a thermal conduction path from the integrated circuit device 406 to an environment external to the integrated circuit packaging system 400. Examples of the inner interconnects 408 are short connectors, conductive posts, conductive pillars, conductive pins, vertical insertion areas (VIA), planar conductive structures, leads, or a combination thereof.

Each of the inner interconnects 408 can include an end with an inner exposed contact surface 426 and an opposite end with an inner attachment surface 428. The inner interconnects 408 can have any different shape, size, or distribution to provide capabilities for fan-in connections with the base circuit assembly 402. The inner attachment surface 428 can be connected to the top conductive trace 422 exposed adjacent the second side 424 of the top substrate 414 and over the integrated circuit device 406.

Each of the outer interconnects 410, such as through conductors, conductive posts, pillars, pins, vertical insertion areas (VIA), or leads, include an end with an outer exposed contact surface 430 and an opposite end with an outer attachment surface 432. The outer interconnects 410 can have any length preferably greater than a length of the inner interconnects 408. The outer interconnects 410 can also be formed having different shapes, sizes, or distributions to provide capabilities for fan-out connections with the base circuit assembly 402.

The outer interconnects 410 can be located adjacent the top substrate 414 and around the integrated circuit device 406. The outer attachment surface 432 can be connected to the bottom conductive trace 418 of the bottom substrate 404 exposed adjacent a perimeter of the component side 416.

For purposes of illustration, the outer interconnects 410 are shown longer than the inner interconnects 408. Both the outer interconnects 410 and the inner interconnects 408 are shown having similar shape and distribution. The outer interconnects 410 and the inner interconnects 408 can each have any different length, shape, or distribution. For example, the outer interconnects 410 can be spaced further apart than the inner interconnects 408, the outer interconnects 410 can be curved shaped, or the inner interconnects 408 can be non-vertical shaped.

An encapsulant 434 can cover the component side 416, the top substrate 414, and surround the outer interconnects 410 and the inner interconnects 408. The encapsulant 434 can protect the integrated circuit packaging system 400 using materials such as an epoxy, an epoxy blend, a silicone material, a polymide, or similar molding compound.

The outer exposed contact surface 430 and the inner exposed contact surface 426 can preferably be adjacent and coplanar with a top encapsulant surface 436 of the encapsulant 434. The inner exposed contact surface 426 and the outer exposed contact surface 430 exhibit physical tool marks. The outer interconnects 410 can extend from the top encapsulant surface 436 to a surface opposite the top encapsulant surface 436 of the encapsulant 434.

A first component 444, such as a package, a module, a component stack, or a discrete component, can be mounted over the encapsulant 434 using first component connectors 446. The first component connectors 446, such as conductive balls, bumps, pins, or pads, can be used to connect the first component 444 with the inner exposed contact surface 426 adjacent the top encapsulant surface 436.

A second component 448, such as a package, a module, a component stack, or a discrete component, can be mounted over the first component 444 using second component connectors 450. The second component connectors 450, such as conductive balls, bumps, pins, or pads, can be used to connect the second component 448 with the outer exposed contact surface 430 adjacent the top encapsulant surface 436.

System connectors 452 can be attached to the bottom conductive trace 418 exposed adjacent the system side 419. The system connectors 452, such as solder balls, solder bumps, or similar conductive connectors, can have any shape or distribution. The system connectors 452 can be used to provide connectivity between the integrated circuit packaging system 400 and a next level of system integration such as a printed circuit board or another integrated circuit package.

Figure 5:
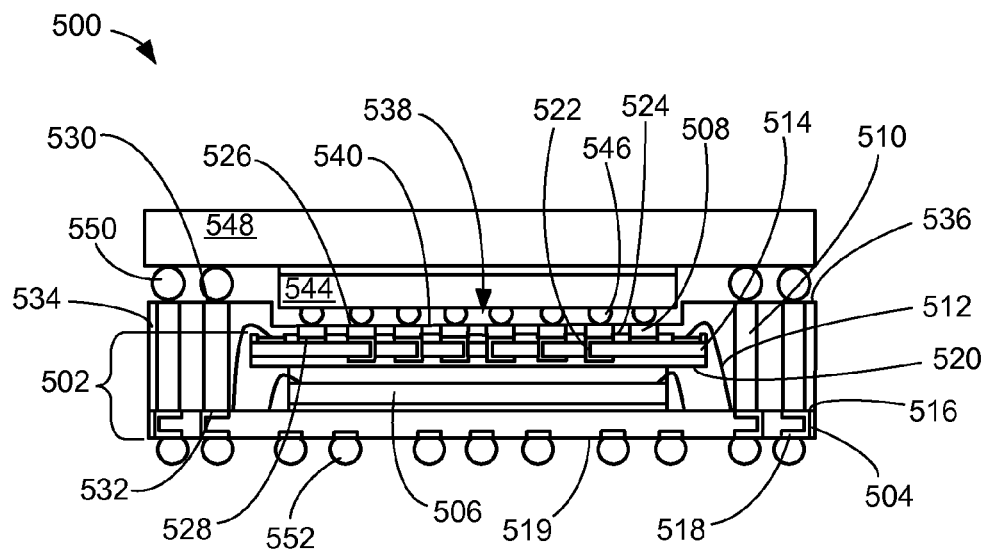
FIG. 5 is a cross-sectional view similar to FIG. 2 of an integrated circuit packaging system in a fourth embodiment of the present invention.

Referring now to FIG. 5, therein is shown a cross-sectional view similar to FIG. 2 of an integrated circuit packaging system 500 in a fourth embodiment of the present invention. The integrated circuit packaging system 500 can include a base circuit assembly 502, such as a fan-in package on package (Fi-POP) structure, with a bottom substrate 504, an integrated circuit device 506, inner interconnects 508, outer interconnects 510, base interconnects 512, and a top substrate 514.

The integrated circuit device 506, such as a flip chip, an internal stacking module (ISM), or a package with circuitry, can be mounted, such as by an adhesive mounting, over a component side 516 of the bottom substrate 504. An active side of the integrated circuit device 506 can be facing away from the component side 516.

A bottom conductive trace 518, such as a copper trace, an aluminum trace, or other metal trace with similar characteristics, can be exposed adjacent the component side 516 and a system side 519. The bottom conductive trace 518 can be formed within the bottom substrate 504.

The bottom conductive trace 518 can provide connectivity between the component side 516 and the system side 519 of the bottom substrate 504 opposite the component side 516. The active side of the integrated circuit device 506 can be connected to the bottom conductive trace 518 adjacent the component side 516 using the base interconnects 512 such as wires, leads, balls, or bumps.

The top substrate 514, such as a substrate, a circuit board, or an interposer, can be mounted, such as by an adhesive mounting, over the integrated circuit device 506 with a first side 520 of the top substrate 514 facing the integrated circuit device 506. The top substrate 514 can include a top conductive trace 522 exposed adjacent the first side 520, exposed adjacent a second side 524 of the top substrate 514 opposite the first side 520, and within the top substrate 514.

The top conductive trace 522, such as a copper trace, an aluminum trace, or other metal trace with similar characteristics, can provide connectivity between the first side 520 and the second side 524 of the top substrate 514. The top conductive trace 522 exposed along a perimeter of the second side 524 can be connected with the bottom conductive trace 518 of the component side 516 using the base interconnects 512.

Each of the inner interconnects 508 provide an electrical or a thermal conduction path from the integrated circuit device 506 to an environment external to the integrated circuit packaging system 500. Examples of the inner interconnects 508 are short connectors, conductive posts, conductive pillars, conductive pins, vertical insertion areas (VIA), planar conductive structures, leads, or a combination thereof.

Each of the inner interconnects 508 can include an end with an inner exposed contact surface 526 and an opposite end with an inner attachment surface 528. The inner interconnects 508 can have any different shape, size, or distribution to provide capabilities for fan-in connections with the base circuit assembly 502. The inner attachment surface 528 can be connected to the top conductive trace 522 exposed adjacent the second side 524 of the top substrate 514 and over the integrated circuit device 506.

Each of the outer interconnects 510, such as through conductors, conductive posts, pillars, pins, vertical insertion areas (VIA), or leads, include an end with an outer exposed contact surface 530 and an opposite end with an outer attachment surface 532. The outer interconnects 510 can have any length preferably greater than a length of the inner interconnects 508. The outer interconnects 510 can also be formed having different shapes, sizes, or distributions to provide capabilities for fan-out connections with the base circuit assembly 502.

The outer interconnects 510 can be located adjacent the top substrate 514 and around the integrated circuit device 506.

The outer attachment surface 532 can be connected to the bottom conductive trace 518 of the bottom substrate 504 exposed adjacent a perimeter of the component side 516.

For purposes of illustration, the outer interconnects 510 are shown longer than the inner interconnects 508. Both the outer interconnects 510 and the inner interconnects 508 are shown having similar shape and distribution. The outer interconnects 510 and the inner interconnects 508 can each have any different length, shape, or distribution. For example, the outer interconnects 510 can be spaced further apart than the inner interconnects 508, the outer interconnects 510 can be curved shaped, or the inner interconnects 508 can be non-vertical shaped.

An encapsulant 534 can cover the component side 516, the top substrate 514, and surround the outer interconnects 510 and the inner interconnects 508. The encapsulant 534 can protect the integrated circuit packaging system 500 using materials such as an epoxy, an epoxy blend, a silicone material, a polymide, or similar molding compound. The encapsulant 534 includes having a top encapsulant surface 536 and an encapsulant cavity 538.

The encapsulant cavity 538 can be located over the top substrate 514 and formed by a partial removal of the top encapsulant surface 536. A cavity bottom surface 540 of the encapsulant cavity 538 can be located below and parallel with the top encapsulant surface 536. The outer interconnects 510 can extend from the top encapsulant surface 536 to a surface opposite the top encapsulant surface 536 of the encapsulant 534.

The outer exposed contact surface 530 can preferably be adjacent and coplanar with the top encapsulant surface 536. The inner exposed contact surface 526 can preferably be adjacent and coplanar with the cavity bottom surface 540. The inner exposed contact surface 526 and the outer exposed contact surface 530 exhibit physical tool marks.

A first component 544, such as a package, a module, a component stack, or a discrete component, can be mounted over the encapsulant 534 using first component connectors 546. The first component connectors 546, such as conductive balls, bumps, pins, or pads, can be used to connect the first component 544 with the inner exposed contact surface 526 adjacent the top encapsulant surface 536.

A second component 548, such as a package, a module, a component stack, or a discrete component, can be mounted over the first component 544 using second component connectors 550. The second component connectors 550, such as conductive balls, bumps, pins, or pads, can be used to connect the second component 548 with the outer exposed contact surface 530 adjacent the top encapsulant surface 536.

System connectors 552 can be attached to the bottom conductive trace 518 exposed adjacent the system side 519. The system connectors 552, such as solder balls, solder bumps, or similar conductive connectors, can have any shape or distribution. The system connectors 552 can be used to provide connectivity between the integrated circuit packaging system 500 and a next level of system integration such as a printed circuit board or another integrated circuit package.

Figure 6:
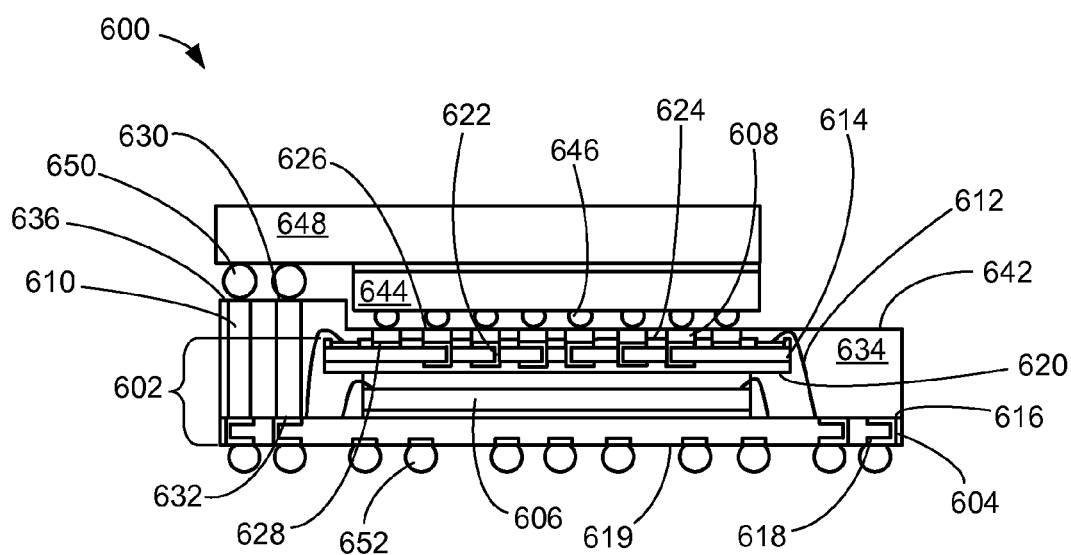
FIG. 6 is a cross-sectional view similar to FIG. 2 of an integrated circuit packaging system in a fifth embodiment of the present invention.

Referring now to FIG. 6, therein is shown a cross-sectional view similar to FIG. 2 of an integrated circuit packaging system 600 in a fifth embodiment of the present invention. The integrated circuit packaging system 600 can include a base circuit assembly 602, such as a fan-in package on package (Fi-POP) structure, with a bottom substrate 604, an integrated circuit device 606, inner interconnects 608, outer interconnects 610, base interconnects 612, and a top substrate 614.

The integrated circuit device 606, such as a flip chip, an internal stacking module (ISM), or a package with circuitry, can be mounted, such as by an adhesive mounting, over a component side 616 of the bottom substrate 604. An active side of the integrated circuit device 606 can be facing away from the component side 616.

A bottom conductive trace 618, such as a copper trace, an aluminum trace, or other metal trace with similar characteristics, can be exposed adjacent the component side 616 and a system side 619. The bottom conductive trace 618 can be formed within the bottom substrate 604.

The bottom conductive trace 618 can provide connectivity between the component side 616 and the system side 619 of the bottom substrate 604 opposite the component side 616. The active side of the integrated circuit device 606 can be connected to the bottom conductive trace 618 adjacent the component side 616 using the base interconnects 612 such as wires, leads, balls, or bumps.

The top substrate 614, such as a substrate, a circuit board, or an interposer, can be mounted, such as by an adhesive mounting, over the integrated circuit device 606 with a first side 620 of the top substrate 614 facing the integrated circuit device 606. The top substrate 614 can include a top conductive trace 622 exposed adjacent the first side 620, exposed adjacent a second side 624 of the top substrate 614 opposite the first side 620, and within the top substrate 614.

The top conductive trace 622, such as a copper trace, an aluminum trace, or other metal trace with similar characteristics, can provide connectivity between the first side 620 and the second side 624 of the top substrate 614. The top conductive trace 622 exposed along a perimeter of the second side 624 can be connected with the bottom conductive trace 618 of the component side 616 using the base interconnects 612.

Each of the inner interconnects 608 provide an electrical or a thermal conduction path from the integrated circuit device 606 to an environment external to the integrated circuit packaging system 600. Examples of the inner interconnects 608 are short connectors, conductive posts, conductive pillars, conductive pins, vertical insertion areas (VIA), planar conductive structures, leads, or a combination thereof.

Each of the inner interconnects 608 can include an end with an inner exposed contact surface 626 and an opposite end with an inner attachment surface 628. The inner interconnects 608 can have any different shape, size, or distribution to provide capabilities for fan-in connections with the base circuit assembly 602. The inner attachment surface 628 can be connected to the top conductive trace 622 exposed adjacent the second side 624 of the top substrate 614 and over the integrated circuit device 606.

Each of the outer interconnects 610, such as through conductors, conductive posts, pillars, pins, vertical insertion areas (VIA), or leads, include an end with an outer exposed contact surface 630 and an opposite end with an outer attachment surface 632. The outer interconnects 610 can have any length preferably greater than a length of the inner interconnects 608. The outer interconnects 610 can be formed having different shapes, sizes, or distributions to provide capabilities for fan-out connections with the base circuit assembly 602.

For purposes of illustration, the outer interconnects 610 are shown longer than the inner interconnects 608. Both the outer interconnects 610 and the inner interconnects 608 are shown having similar shape and distribution. The outer interconnects 610 and the inner interconnects 608 can each have any different length, shape, or distribution. For example, the outer interconnects 610 can be spaced further apart than the inner interconnects 608, the outer interconnects 610 can be curved shaped, or the inner interconnects 608 can be non-vertical shaped.

The outer interconnects 610 can surround a portion of a perimeter of the top substrate 614 and the integrated circuit device 606. The outer attachment surface 632 can be connected to the bottom conductive trace 618 of the bottom substrate 604 exposed adjacent a perimeter portion of the component side 616.

An encapsulant 634 can cover the component side 616, the top substrate 614, and surround the outer interconnects 610 and the inner interconnects 608. The encapsulant 634 can protect the integrated circuit packaging system 600 using materials such as an epoxy, an epoxy blend, a silicone material, a polymide, or similar molding compound. The encapsulant 634 includes having a top encapsulant surface 636 and a step down surface 642.

The step down surface 642 can be located over the top substrate 614. The step down surface 642 can extend horizontally over a portion adjacent the perimeter of the top substrate 614 opposite the portion having the outer interconnects 610. The step down surface 642 can be formed by a partial removal of the top encapsulant surface 636. The step down surface 642 can be located below and parallel with the top encapsulant surface 636.

The outer exposed contact surface 630 can preferably be adjacent and coplanar with the top encapsulant surface 636 or the step down surface 642. The outer interconnects 610 can extend from the top encapsulant surface 636 or the step down surface 642 to a surface opposite the top encapsulant surface 636 of the encapsulant 634.

The inner exposed contact surface 626 can preferably be adjacent and coplanar with the step down surface 642. The inner exposed contact surface 626 and the outer exposed contact surface 630 exhibit physical tool marks.

A first component 644, such as a package, a module, a component stack, or a discrete component, can be mounted over the encapsulant 634 using first component connectors 646. The first component connectors 646, such as conductive balls, bumps, pins, or pads, can be used to connect the first component 644 with the inner exposed contact surface 626 adjacent the top encapsulant surface 636.

A second component 648, such as a package, a module, a component stack, or a discrete component, can be mounted with an offset over the first component 644 using second component connectors 650. The second component connectors 650, such as conductive balls, bumps, pins, or pads, can be used to connect the second component 648 with the outer exposed contact surface 630 adjacent the top encapsulant surface 636.

System connectors 652 can be attached to the bottom conductive trace 618 exposed adjacent the system side 619. The system connectors 652, such as solder balls, solder bumps, or similar conductive connectors, can have any shape or distribution. The system connectors 652 can be used to provide connectivity between the integrated circuit packaging system 600 and a next level of system integration such as a printed circuit board or another integrated circuit package.

Figure 7:
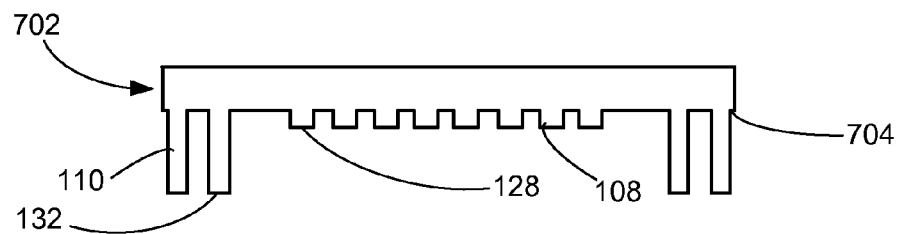
FIG. 7 is a cross-sectional view of a pre-formed conductive frame for the outer interconnects and the inner interconnects.

Referring now to FIG. 7, therein is shown a cross-sectional view of a pre-formed conductive frame 702 for the outer interconnects 110 and the inner interconnects 108. The pre-formed conductive frame 702 provides support and positioning of the outer interconnects 110 and the inner interconnects 108 during processing of the integrated circuit packaging system 100 of FIG. 1. The pre-formed conductive frame 702, such as of a copper, an aluminum, a metal alloy, or a combinational material thereof, can be formed having the outer interconnects 110 and the inner interconnects 108. The outer interconnects 110 and the inner interconnects 108 can extend away from a non-vertical side 704 of the pre-formed conductive frame 702, the outer interconnects 110 preferably extending further than the inner interconnects 108.

The outer interconnects 110 can include the outer attachment surface 132 at an end opposite the end of the outer interconnects 110 connected to the non-vertical side 704. The inner interconnects 108 can include the inner attachment surface 128 at an end opposite the end of the outer interconnects 110 connected to the non-vertical side 704. The outer interconnects 110 or the inner interconnects 108 can be formed having a shape such as a post, a pillar, a pin, a VIA, or a lead. The outer interconnects 110 or the inner interconnects 10 can have a dimensional length substantially greater than an associated dimensional thickness.

The pre-formed conductive frame 702 can be formed as an integral single structure having all of the outer interconnects 110 and the inner interconnects 108 necessary for the integrated circuit packaging system 100. Alternatively, the pre-formed conductive frame 702 could be formed having the outer interconnects 110 and the inner interconnects 108 for a single cross-sectional row and multiple copies of the pre-formed conductive frame 702 could be combined to form all of the outer interconnects 110 and the inner interconnects 108 for the integrated circuit packaging system 100.

Figure 8:
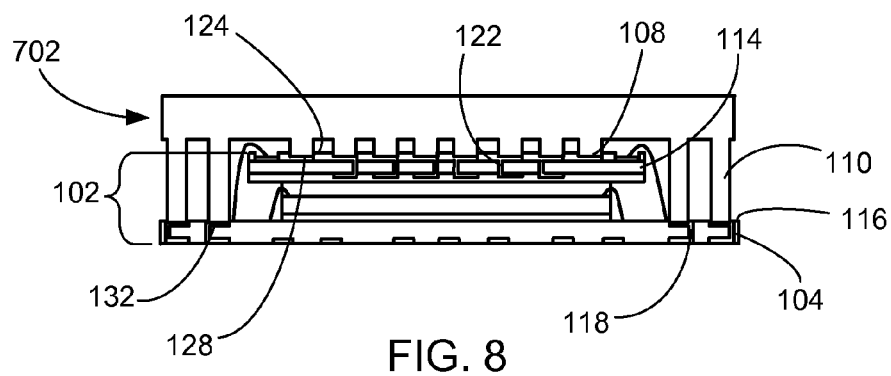
FIG. 8 is the structure of FIG. 7 in an attaching phase of the pre-formed conductive frame.

Referring now to FIG. 8, therein is shown the structure of FIG. 7 in an attaching phase of the pre-formed conductive frame 702. The pre-formed conductive frame 702 can be oriented over the component side 116 of the base circuit assembly 102.

The outer attachment surface 132 of the outer interconnects 110 can be attached to the bottom conductive trace 118 adjacent the component side 116 of the bottom substrate 104 using a process such as heat, pressure, ultrasonic energy, or combination thereof.

The inner attachment surface 128 of the inner interconnects 108 can be attached to the top conductive trace 122 adjacent the second side 124 of the top substrate 114 using an attaching process such as a process utilizing some combination of heat, pressure, or ultrasonic energy. The inner interconnects 108 and the outer interconnects 110 can be substantially vertical.

Figure 9:
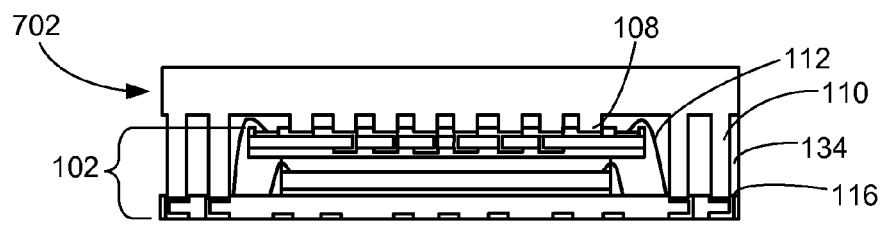
FIG. 9 is the structure of FIG. 8 in an encapsulating phase.

Referring now to FIG. 9, therein is shown the structure of FIG. 8 in an encapsulating phase. The component side 116 of the base circuit assembly 102, the base circuit assembly 102, and the base interconnects 112 can be covered with the encapsulant 134 using an encapsulation process. The encapsulation process can be used to form the encapsulant 134 to surround the outer interconnects 110 and the inner interconnects 108 extending from the pre-formed conductive frame 702.

Figure 10:
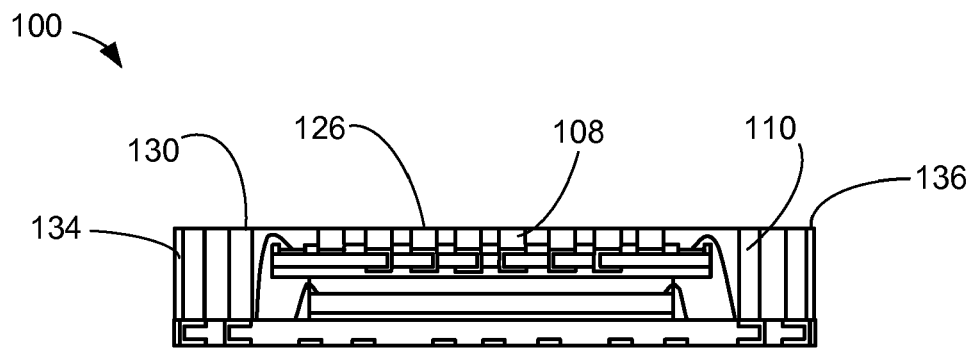
FIG. 10 is the structure of FIG. 9 in a removal phase of the integrated circuit packaging system of FIG. 1.

Referring now to FIG. 10, therein is shown the structure of FIG. 9 in a removal phase of the integrated circuit packaging system 100 of FIG. 1. A portion of the pre-formed conductive frame 702 of FIG. 9 and a portion of the encapsulant 134 adjacent the pre-formed conductive frame 702 can be removed using a removal process such as a grinding, a sanding, an etching, a polishing, a cutting, or a sawing process.

The removal process can expose the inner exposed contact surface 126 of the inner interconnects 108 and the outer exposed contact surface 130 of the outer interconnects 110. The inner exposed contact surface 126 can be adjacent and coplanar with the top encapsulant surface 136. The outer exposed contact surface 130 can be adjacent and coplanar with the top encapsulant surface 136.

The inner exposed contact surface 126 and the outer exposed contact surface 130 exhibit physical tool marks as a result of the removal process.

Figure 11:
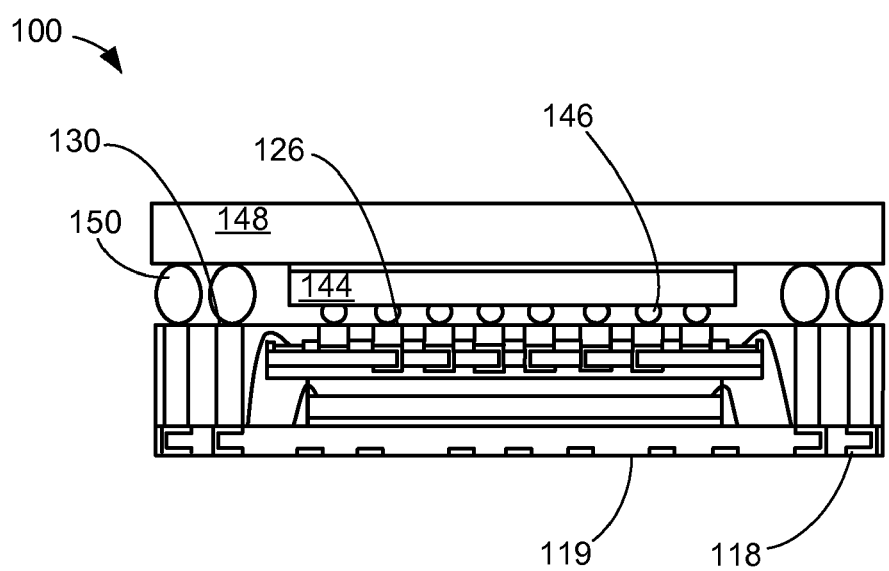
FIG. 11 is the structure of FIG. 10 in a package integrating phase.

Referring now to FIG. 11, therein is shown the structure of FIG. 10 in a package integrating phase. The first component connectors 146 can be used to connect the first component 144 with the inner exposed contact surface 126 using an attaching process such as a solder reflow process with convection heating or laser energy. The second component connectors 150 can be used to connect the second component 148 with the outer exposed contact surface 130 using the attaching process.

The system connectors 152 of FIG. 1 can be attached to the bottom conductive trace 118 exposed adjacent the system side 119 using the attaching process. The integrated circuit packaging system 100 could be further integrated into a next level of integration such as a circuit board, a package, or any other component having technology compatible with the system connectors 152.

Figure 12:
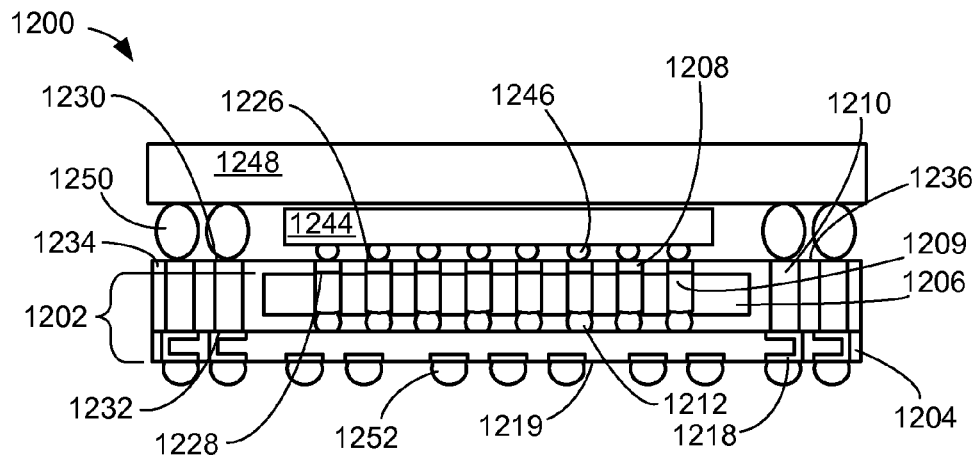
FIG. 12 is a cross-sectional view similar to FIG. 2 of an integrated circuit packaging system in a sixth embodiment of the present invention.

Referring now to FIG. 12, therein is shown a cross-sectional view similar to FIG. 2 of an integrated circuit packaging system 1200 in a sixth embodiment of the present invention. The integrated circuit packaging system 1200 can include a base circuit assembly 1202, such as a fan-in package on package (Fi-POP) structure, with a bottom substrate 1204, an integrated circuit device 1206, inner interconnects 1208, outer interconnects 1210, and base interconnects 1212.

The integrated circuit device 1206 is an integrated circuit die or a flip chip having through silicon vias 1209. The integrated circuit device 1206 can include a non-active side and an active side having circuitry fabricated thereon and at a side opposite the non-active side. The through silicon vias 1209 are conductive linear structures traversing through the integrated circuit device 1206. The through silicon vias 1209 extend through the active side and the non-active side.

The base interconnects 1212 are electrical conductive structures providing mechanical and electrical connections between the integrated circuit device 1206 and the bottom substrate 1204. The base interconnects 1212 can connect to the active side and to the through silicon vias 1209.

Each of the inner interconnects 1208 provide an electrical or a thermal conduction path from the integrated circuit device 1206 to an environment external to the integrated circuit packaging system 1200. Examples of the inner interconnects 1208 are short connectors, conductive posts, conductive pillars, conductive pins, vertical insertion areas (VIA), planar conductive structures, leads, or a combination thereof.

Each of the inner interconnects 1208 can include an end with an inner exposed contact surface 1226 and an opposite end with an inner attachment surface 1228. The inner interconnects 1208 can have any different shape, size, or distribution to provide capabilities for fan-in connections with the base circuit assembly 1202. The inner attachment surface 1228 can be connected to the through silicon vias 1209 exposed at the non-active side of the integrated circuit device 1206.

Each of the outer interconnects 1210, such as through conductors, conductive posts, pillars, pins, vertical insertion areas (VIA), or leads, include an end with an outer exposed contact surface 1230 and an opposite end with an outer attachment surface 1232. The outer interconnects 1210 can have any length preferably greater than a length of the inner interconnects 1208. The outer interconnects 1210 can also be formed having different shapes, sizes, or distributions to provide capabilities for fan-out connections with the base circuit assembly 1202. The outer interconnects 1210 can be located adjacent and around the integrated circuit device 1206. The outer attachment surface 1232 can be connected to the bottom substrate 1204.

For purposes of illustration, the outer interconnects 1210 are shown longer than the inner interconnects 1208. Both the outer interconnects 1210 and the inner interconnects 1208 are shown having similar shape and distribution. The outer interconnects 1210 and the inner interconnects 1208 can each have any different length, shape, or distribution. For example, the outer interconnects 1210 can be spaced further apart than the inner interconnects 1208, the outer interconnects 1210 can be curved shaped, or the inner interconnects 1208 can be non-vertical shaped.

An encapsulant 1234 can cover the integrated circuit device 1206 over the bottom substrate 1204 and can surround the outer interconnects 1210 and the inner interconnects 1208. The encapsulant 1234 can protect the integrated circuit packaging system 1200 using materials such as an epoxy, an epoxy blend, a silicone material, a polymide, or similar molding compound.

The outer exposed contact surface 1230 and the inner exposed contact surface 1226 can preferably be adjacent and coplanar with a top encapsulant surface 1236 of the encapsulant 1234. The inner exposed contact surface 1226 and the outer exposed contact surface 1230 exhibit physical tool marks such as grinding marks or coining marks.

A first component 1244 is a circuit component that is an active device or a passive device. Examples of the first component 1244 are a package, a module, a component stack, or a discrete component. The first component 1244 can be mounted over the encapsulant 1234 using first component connectors 1246.

The first component connectors 1246 connect the first component 1244 to a next system level. Examples of the first component connectors 1246 are conductive balls, bumps, pins, or pads and can be used to connect the first component 1244 with the inner exposed contact surface 1226 exposed at the top encapsulant surface 1236.

A second component 1248 is a circuit component that is an active device or a passive device. Examples of the second component 1248 are a package, a module, a component stack, or a discrete component. The second component 1248 can be mounted over the first component 1244 using second component connectors 1250.

The second component connectors 1250 connect the second component 1248 to a next system level. Examples of the second component connectors 1250 are conductive balls, bumps, pins, or pads. The second component connectors 1250 can be used to connect the second component 1248 with the outer exposed contact surface 1230.

System connectors 1252 can be attached to the bottom conductive trace 1218 exposed adjacent the system side 1219. The system connectors 1252, such as solder balls, solder bumps, or similar conductive connectors, can have any shape or distribution. The system connectors 1252 can be used to provide connectivity between the integrated circuit packaging system 1200 and a next level of system integration such as a printed circuit board or another integrated circuit package.

It has been discovered that the inner interconnects 1208 provide the integrated circuit packaging system 1200 with high connectivity into the integrated circuit packaging system 1200. The inner interconnects 1208 provides connection to the active side of the integrated circuit device 1206 going through the through silicon vias 1209 and to the bottom substrate 1204 in addition to the outer interconnects 1210 to the bottom substrate 1204.

Figure 13:
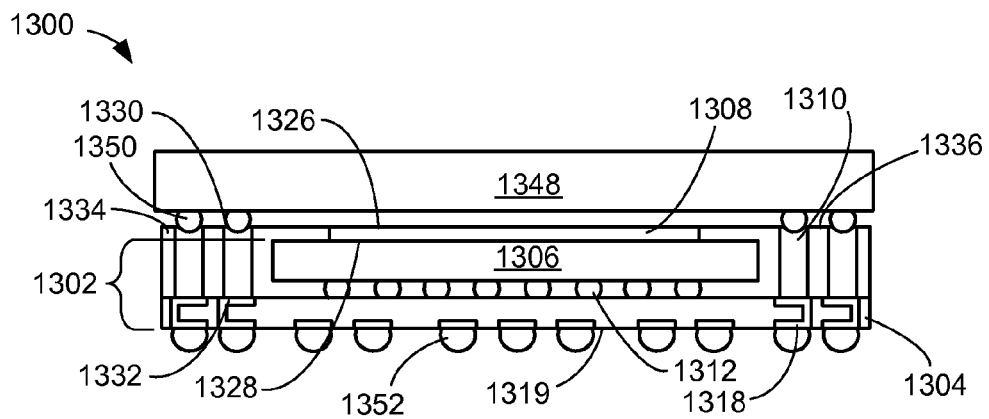
FIG. 13 is a cross-sectional view similar to FIG. 2 of an integrated circuit packaging system in a seventh embodiment of the present invention.

Referring now to FIG. 13, therein is shown a cross-sectional view similar to FIG. 2 of an integrated circuit packaging system 1300 in a seventh embodiment of the present invention. The integrated circuit packaging system 1300 can include a base circuit assembly 1302, such as a fan-in package on package (Fi-POP) structure, with a bottom substrate 1304, an integrated circuit device 1306, an inner interconnect 1308, outer interconnects 1310, and base interconnects 1312.

The integrated circuit device 1306 is an integrated circuit die or a flip chip. The integrated circuit device 1306 can include a non-active side and an active side having circuitry fabricated thereon and at a side opposite the non-active side.

The base interconnects 1312 are the electrical conductive structure providing mechanical and electrical connections between the integrated circuit device 1306 and the bottom substrate 1304. The base interconnects 1312 can connect to the active side.

The inner interconnect 1308 provides electrical or thermal conduction path from the integrated circuit device 1306 to the environment external to the integrated circuit packaging system 1300. Examples of the inner interconnect 1308 are short connectors, conductive posts, conductive pillars, conductive pins, vertical insertion areas (VIA), planar conductive structures, leads, or a combination thereof.

The inner interconnect 1308 can include an end with an inner exposed contact surface 1326 and an opposite end with an inner attachment surface 1328. The inner interconnect 1308 can have any different shape, size, or distribution to provide capabilities for fan-in connections with the base circuit assembly 1302. The inner attachment surface 1328 can attach to the non-active side of the integrated circuit device 1306 such that the inner interconnect 1308 can function as a heat spreader providing a thermal dissipation path from the integrated circuit device 1306 to an external environment.

Each of the outer interconnects 1310, such as through conductors, conductive posts, pillars, pins, vertical insertion areas (VIA), or leads, include an end with an outer exposed contact surface 1330 and an opposite end with an outer attachment surface 1332. The outer interconnects 1310 can have any length preferably greater than a length of the inner interconnect 1308. The outer interconnects 1310 can also be formed having different shapes, sizes, or distributions to provide capabilities for fan-out connections with the base circuit assembly 1302. The outer interconnects 1310 can be located adjacent and around the integrated circuit device 1306. The outer attachment surface 1332 can be connected to the bottom substrate 1304.

An encapsulant 1334 can cover integrated circuit device 1306 over the bottom substrate 1304 and can surround the outer interconnects 1310 and the inner interconnect 1308. The encapsulant 1334 can protect the integrated circuit packaging system 1300 using materials such as an epoxy, an epoxy blend, a silicone material, a polymide, or similar molding compound.

The outer exposed contact surface 1330 and the inner exposed contact surface 1326 can preferably be adjacent and coplanar with a top encapsulant surface 1336 of the encapsulant 1334. The inner exposed contact surface 1326 and the outer exposed contact surface 1330 exhibit physical tool marks such as grinding marks or coining marks.

A component 1348 is a circuit component that is an active device or a passive device. Examples of the component 1348 are a package, a module, a component stack, or a discrete component. The component 1348 can be mounted to the outer interconnects 1310 using component connectors 1350 and over the inner interconnect 1308.

The component connectors 1350 connect the component 1348 to a next system level. Examples of the component connectors 1350 are conductive balls, bumps, pins, or pads. The component connectors 1350 can be used to connect the component 1348 with the outer exposed contact surface 1330 adjacent the top encapsulant surface 1336.

System connectors 1352 can be attached to the bottom conductive trace 1318 exposed adjacent the system side 1319. The system connectors 1352, such as solder balls, solder bumps, or similar conductive connectors, can have any shape or distribution. The system connectors 1352 can be used to provide connectivity between the integrated circuit packaging system 1300 and a next level of system integration such as a printed circuit board or another integrated circuit package.

Figure 14:
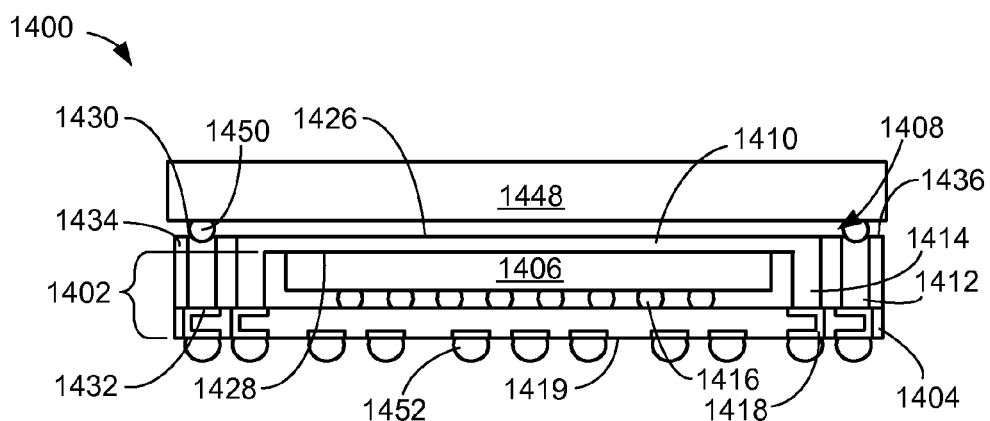
FIG. 14 is a cross-sectional view similar to FIG. 2 of an integrated circuit packaging system in an eighth embodiment of the present invention.

Referring now to FIG. 14, therein is shown a cross-sectional view similar to FIG. 2 of an integrated circuit packaging system 1400 in an eighth embodiment of the present invention. The integrated circuit packaging system 1400 can include a base circuit assembly 1402, such as a fan-in package on package (Fi-POP) structure, with a bottom substrate 1404, an integrated circuit device 1406, an inner interconnect 1408, outer interconnects 1412, and base interconnects 1416.

The integrated circuit device 1406 is an integrated circuit die or a flip chip. The integrated circuit device 1406 can include a non-active side and an active side having circuitry fabricated thereon and at a side opposite the non-active side.

The base interconnects 1416 are the electrical conductive structure providing mechanical and electrical connections between the integrated circuit device 1406 and the bottom substrate 1404. The base interconnects 1416 can connect to the active side of the integrated circuit device 1406.

The inner interconnect 1408 provides electrical or thermal conduction path from the integrated circuit device 1406 to an environment external to the integrated circuit packaging system 1400. The inner interconnect 1408 can include a planar portion 1410 and a vertical portion 1414 integral to the planar portion 1410. The planar portion 1410 can connect to the non-active side of the integrated circuit device 1406.

The vertical portion 1414 can extend from the planar portion 1410 and attach to the bottom substrate 1404. The vertical portion 1414 can be grounded or attach to a ground connection at the bottom substrate 1404.

The planar portion 1410 can include an end with an inner exposed contact surface 1426 and an opposite end with an inner attachment surface 1428. The inner attachment surface 1428 can attach to the non-active side of the integrated circuit device 1406 such that the inner interconnect 1408 can function as a heat spreader providing a thermal dissipation path from the integrated circuit device 1406 to the external environment. The inner interconnect 1408 can also function as an electromagnetic interference shield when the vertical portion 1414 is grounded.

Each of the outer interconnects 1412, such as through conductors, conductive posts, pillars, pins, vertical insertion areas (VIA), or leads, include an end with an outer exposed contact surface 1430 and an opposite end with an outer attachment surface 1432. The outer interconnects 1412 can have any length preferably greater than a length of the inner interconnect 1408. The outer interconnects 1412 can also be formed having different shapes, sizes, or distributions to provide capabilities for fan-out connections with the base circuit assembly 1402. The outer interconnects 1412 can be located adjacent to the vertical portion 1414 and around the integrated circuit device 1406. The vertical portion 1414 can be between the outer interconnects 1412 and the integrated circuit device 1406. The outer attachment surface 1432 can be connected to the bottom substrate 1404.

An encapsulant 1434 can cover integrated circuit device 1406 over the bottom substrate 1404 and can surround the outer interconnects 1412 and the inner interconnect 1408. The encapsulant 1434 can protect the integrated circuit packaging system 1400 using materials such as an epoxy, an epoxy blend, a silicone material, a polymide, or similar molding compound.

The outer exposed contact surface 1430 and the inner exposed contact surface 1426 can preferably be adjacent and coplanar with a top encapsulant surface 1436 of the encapsulant 1434. The inner exposed contact surface 1426 and the outer exposed contact surface 1430 exhibit physical tool marks such as grinding marks or coining marks.

A component 1448 is a circuit component that is an active device or a passive device. Examples of the component 1448 are a package, a module, a component stack, or a discrete component. The component 1448 can be mounted to the outer interconnects 1412 using component connectors 1450 and over the inner interconnect 1408.

The component connectors 1450 connect the component 1448 to a next system level. Examples of the component connectors 1450 are conductive balls, bumps, pins, or pads. The component connectors 1450 can be used to connect the component 1448 with the outer exposed contact surface 1430 adjacent the top encapsulant surface 1436.

System connectors 1452 can be attached to the bottom conductive trace 1418 exposed adjacent a system side 1419 of the bottom substrate 1404. The system connectors 1452, such as solder balls, solder bumps, or similar conductive connectors, can have any shape or distribution. The system connectors 1452 can be used to provide connectivity between the integrated circuit packaging system 1400 and a next level of system integration such as a printed circuit board or another integrated circuit package.

It has been discovered that the inner interconnect 1408 with the planar portion 1410 and the vertical portion 1414 provides the integrated circuit packaging system 1400 with improved electromagnetic interference shielding and thermal management. The planar portion 1410 improves the thermal management by providing a thermal dissipation path from the integrated circuit device 1406 to the external environment as well as the vertical portion 1414 providing for an additional thermal dissipation path to the bottom substrate 1404 and eventually to the external environment through the bottom substrate 1404. The inner interconnect 1408 improves electromagnetic interference shielding by providing an EMI shield with the vertical portion 1414 tied to a ground connect at the bottom substrate 1404.

Figure 15:
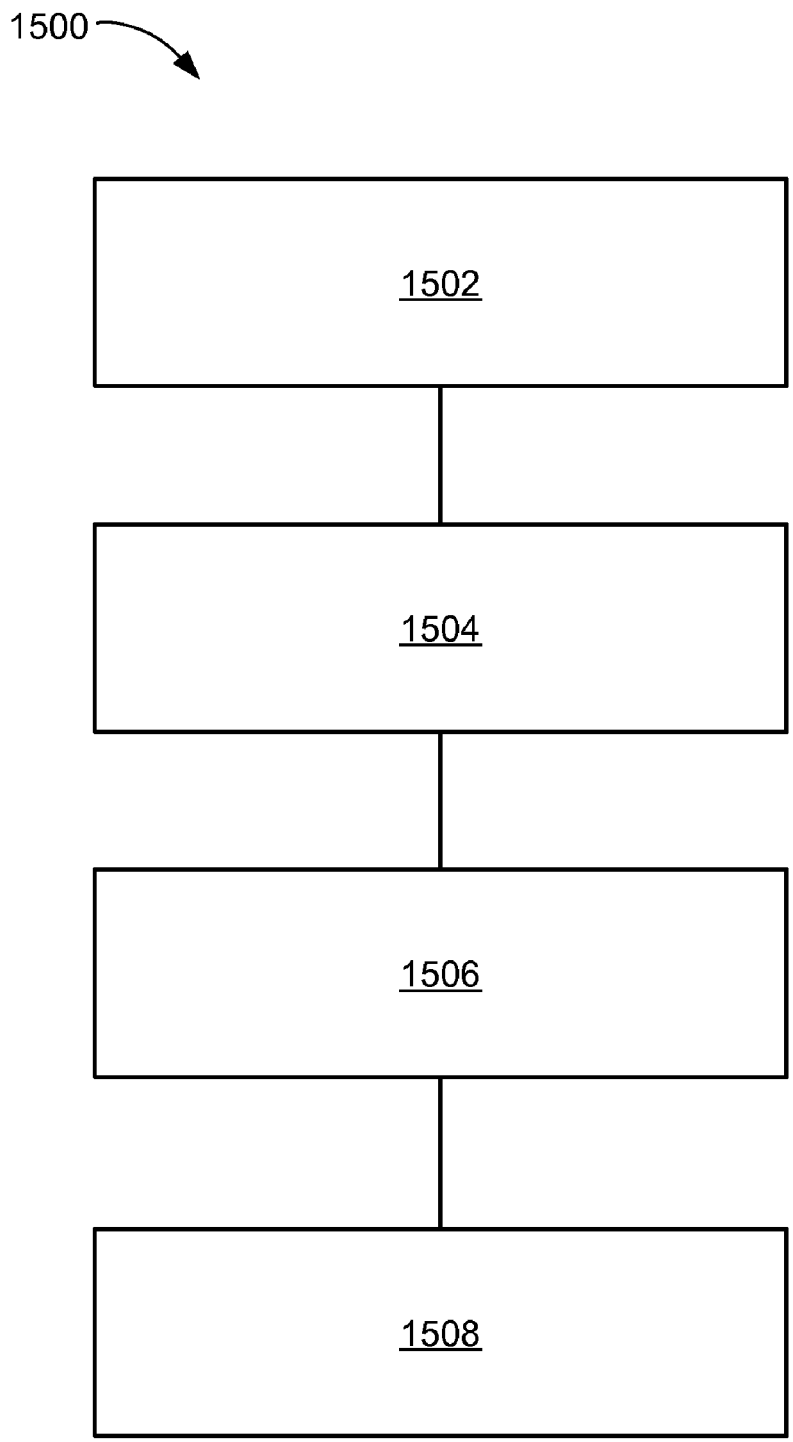
FIG. 15 is a flow chart of a method of manufacture of an integrated circuit packaging system in a further embodiment of the present invention.

Referring now to FIG. 15, therein is shown a flow chart of a method 1500 of manufacture of an integrated circuit packaging system in a further embodiment of the present invention. The method 1500 includes providing a base circuit assembly having an integrated circuit device in a block 1502; mounting a pre-formed conductive frame having an outer interconnect and an inner interconnect over the base circuit assembly, the inner interconnect on the integrated circuit device and the outer interconnect around the integrated circuit device in a block 1504; applying an encapsulant over the inner interconnect and the outer interconnect in a block 1506; and removing a portion of the pre-formed conductive frame exposing an end of the inner interconnect and the outer interconnect in a block 1508.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing package on package systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a base circuit assembly having an integrated circuit device;
   mounting a pre-formed conductive frame having an outer interconnect and an inner interconnect over the base circuit assembly, the inner interconnect on the integrated circuit device and the outer interconnect around the integrated circuit device;
   applying an encapsulant over the inner interconnect and the outer interconnect; and
   removing a portion of the pre-formed conductive frame exposing an end of the inner interconnect and the outer interconnect.

2. The method as claimed in claim 1 wherein removing the portion of the pre-formed conductive frame includes removing a portion of the inner interconnect and a portion of the encapsulant to form an encapsulant cavity.

3. The method as claimed in claim 1 wherein:
   providing the base circuit assembly includes providing a bottom substrate with the integrated circuit device thereon;
   mounting the pre-formed conductive frame having the inner interconnect includes mounting the inner interconnect having a vertical portion mounted to the bottom substrate; and
   removing the portion of the pre-formed conductive frame includes exposing a planar portion integral to the vertical portion.

4. The method as claimed in claim 1 further comprising:
   connecting a first component to the inner interconnect;
   mounting a second component over the first component; and
   connecting the second component to the outer interconnect.

5. The method as claimed in claim 1 wherein:
   providing the base circuit assembly having the integrated circuit device includes providing the integrated circuit device having a through silicon via; and
   mounting the pre-formed conductive frame having the inner interconnect includes mounting the inner interconnect on the through silicon via.

6. A method of manufacture of an integrated circuit packaging system comprising:
   providing a base circuit assembly having an integrated circuit device and a bottom substrate;
   mounting a pre-formed conductive frame having an outer interconnect and an inner interconnect over the base circuit assembly, the inner interconnect on the integrated circuit device and the outer interconnect around the integrated circuit device;

applying an encapsulant over the base circuit assembly, the inner interconnect, and the outer interconnect; and removing a portion of the pre-formed conductive frame exposing an inner exposed contact surface of the inner interconnect and an outer exposed contact surface of the outer interconnect.

7. The method as claimed in claim 6 wherein applying the encapsulant includes surrounding the inner interconnect and the outer interconnect with the encapsulant.

8. The method as claimed in claim 6 further comprising:
connecting a first component with the inner exposed contact surface over the top substrate;
mounting a second component over the first component; and
connecting the second component with the outer exposed contact surface.

9. The method as claimed in claim 6 wherein providing the base circuit assembly includes providing the integrated circuit device mounted to the bottom substrate.

10. The method as claimed in claim 6 wherein mounting the pre-formed conductive frame having the inner interconnect includes mounting the inner interconnect having a vertical portion mounted to the bottom substrate between the integrated circuit device and the outer interconnect.

11. An integrated circuit packaging system comprising:
a base circuit assembly having an integrated circuit device;
an outer interconnect;
an inner interconnect over the base circuit assembly, the inner interconnect on the integrated circuit device and the outer interconnect around the integrated circuit device; and
an encapsulant applied over the inner interconnect and the outer interconnect and with the inner interconnect and the outer interconnect substantially exposed.

12. The system as claimed in claim 11 wherein the encapsulant includes an encapsulant cavity.

13. The system as claimed in claim 11 wherein:
the base circuit assembly includes a bottom substrate with the integrated circuit device thereon; and
the inner interconnect includes a planar portion and a vertical portion, the vertical portion mounted to the bottom substrate and integral to the planar portion.

14. The system as claimed in claim 11 further comprising:
a first component connected with the inner interconnect;
a second component mounted over the first component; and
the second component connected with the outer interconnect.

15. The system as claimed in claim 11 wherein:
the base circuit assembly having the integrated circuit device includes the integrated circuit device having a through silicon via; and
the inner interconnect is on the through silicon via.

16. The system as claimed in claim 11 wherein:
the base circuit assembly includes a bottom substrate; and
the encapsulant is over the base circuit assembly and with an inner exposed contact surface of the inner interconnect and an outer exposed contact surface of the outer interconnect substantially exposed.

17. The system as claimed in claim 16 wherein the encapsulant surrounds the inner interconnect and the outer interconnect.

18. The system as claimed in claim 16 further comprising:
a first component connected with the inner exposed contact surface; and
a second component mounted over the first component and connected with the outer exposed contact surface.

19. The system as claimed in claim 16 wherein the base circuit assembly includes the bottom substrate having the integrated circuit device thereon.

20. The system as claimed in claim 16 wherein the inner interconnect includes a vertical portion mounted to the bottom substrate between the integrated circuit device and the outer interconnect.

* * * * *